United States Patent
Hui et al.

(10) Patent No.: US 8,900,776 B2
(45) Date of Patent: Dec. 2, 2014

(54) MASK PLATE, FATTENING METHOD AND METHOD FOR MANUFACTURING ARRAY SUBSTRATE

(75) Inventors: Guanbao Hui, Beijing (CN); Seungjin Choi, Beijing (CN); Feng Zhang, Beijing (CN); Jianshe Xue, Beijing (CN)

(73) Assignee: Boe Technology Group Co., Ltd., Beijing (CN)

( * ) Notice: Subject to any disclaimer, the term of this patent is extended or adjusted under 35 U.S.C. 154(b) by 309 days.

(21) Appl. No.: 13/347,865

(22) Filed: Jan. 11, 2012

(65) Prior Publication Data

US 2012/0190197 A1     Jul. 26, 2012

(30) Foreign Application Priority Data

Jan. 21, 2011    (CN) .......................... 2011 1 0024105

(51) Int. Cl.
     *G03F 1/76*          (2012.01)
     *G03F 1/68*          (2012.01)
     *H01L 27/12*        (2006.01)

(52) U.S. Cl.
     CPC ............... *G03F 1/76* (2013.01); *H01L 27/1288* (2013.01)
     USPC .............................................. 430/5; 430/394

(58) Field of Classification Search
     USPC ...................... 430/5, 311, 313, 316, 321, 394
     See application file for complete search history.

(56) References Cited

U.S. PATENT DOCUMENTS

| 2009/0136856 A1* | 5/2009 | Lin et al. ........................... 430/5 |
| 2010/0055618 A1 | 3/2010 | Song et al. |
| 2010/0075451 A1 | 3/2010 | Yoo et al. |
| 2010/0295049 A1 | 11/2010 | Yoo et al. |

FOREIGN PATENT DOCUMENTS

| CN | 101034262 A | 9/2007 |
| CN | 101677058 A | 3/2010 |
| CN | 101840149 A | 9/2010 |

OTHER PUBLICATIONS

Li Wenbo, et al; "Mask Used for TFT and TFT-LCD Array Technology", China Academic Journal; Semiconductor Technology, vol. 35, No. 6, Jun. 2010; pp. 522-559.
$2^{nd}$ Chinese Office Action; dated Jun. 5, 2013; Appl. No. 201110024105.7.
Second Chinese Office Action dated Oct. 24, 2013; Appln. No. 201110024105.7.
Chinese Rejection Decision dated Mar. 31, 2014 Appln. No. 201110024105.7.

* cited by examiner

*Primary Examiner* — Stephen Rosasco
(74) *Attorney, Agent, or Firm* — Ladas & Parry LLP

(57) ABSTRACT

An embodiment of the disclosed technology provides a mask plate for photolithography process comprising a first pattern region, a second pattern region having a different exposure level from that of the first pattern region, and a redundant pattern provided between the first pattern region and the second pattern region, wherein the redundant pattern is configured for forming a redundant photoresist pattern so as to prevent developer diffusion at different concentrations across the photoresist redundant pattern.

6 Claims, 3 Drawing Sheets

MASK PLATE, FATTENING METHOD AND METHOD FOR MANUFACTURING ARRAY SUBSTRATE

BACKGROUND

Embodiments of the disclosed technology relate to a mask plate, a patterning method, and a method for manufacturing an array substrate.

A double-tone mask plate (e.g., a gray scale mask plate or a translucent mask plate) can be used in the process of manufacturing the array substrate of a horizontal electric field type thin film transistor liquid crystal display (TFT-LCD). Such a mask plate may comprise three regions, i.e., a transparent region, a light-blocking region and a translucent region. After exposing of photoresist (e.g., positive photoresist) with the mask plate, an exposed region is formed in the photoresist layer corresponding to the transparent region of the mask plate; an non-exposed region is formed in the photoresist layer corresponding to the light-blocking region of the mask plate; and an half-exposed region is formed in the photoresist layer corresponding to the translucent region of the mask plate. After development of the exposed photoresist, the photoresist in the exposed region and a portion of the photoresist in the half-exposed region is removed.

Since the desired patterns (e.g., conductive lines or via holes) in the half-exposed region are formed on the substrate after two subsequent etching processes are performed, the thickness and uniformity of the remaining photoresist in the half-exposed region should be strictly controlled. If the thickness of the remaining photoresist is too big, the time of the subsequent etching will be prolonged. If the thickness is too small, the peripheral morphology of the photoresist will be deteriorated and even a totally uncovered region will occur instead. One of the most important factors affecting the thickness of the remaining photoresist in the half-exposed region is the developer concentration of development solution. During development, the development solution applied to the photoresist reacts with the photoresist to be removed. The amount of the photoresist that is removed within a certain period of time increases with the developer concentration.

Generally, a five-mask process may be used to fabricate the array substrate of a horizontal electric field type TFT-LCD. Specifically, a first mask plate is used to form the patterns of a first transparent common electrode layer; a second mask plate is used to form the patterns of a gate metal layer; a third double-tone mask plate is used to form the patterns of a semiconductor active layer and a source/drain metal electrode layer; a fourth mask plate is used to form the patterns a via hole layer; and a fifth mask plate is used to form a pixel electrode layer. Currently, the first transparent pixel electrode layer and the gate metal layer can be patterned by using a same double-tone mask plate so as to save cost and reduce the amount of the mask processes.

SUMMARY

An embodiment of the disclosed technology provides a mask plate for photolithography process comprising a first pattern region, a second pattern region having a different exposure level from that of the first pattern region, and a redundant pattern provided between the first pattern region and the second pattern region, wherein the redundant pattern is configured for forming a redundant photoresist pattern so as to prevent developer diffusion at different concentrations across the photoresist redundant pattern.

Further another embodiment of the disclosed technology provides a patterning method comprising: forming a structure layer on a substrate; applying a layer of photoresist on the structure layer; exposing the photoresist layer with the mask plate according to claim 1; developing the exposed photoresist layer to form a photoresist mask; and etching the structure layer with the photoresist mask.

Another embodiment of the disclosed technology provides a method for manufacturing the array substrate of a thin film transistor, comprising: performing a first photolithography process on the substrate by using a mask plate according to claim 1, wherein the first pattern region of the mask plate is used to expose a display region of the substrate so as to form a first transparent common electrode and a gate circuit, and the second pattern region of the mask plate is used to expose the peripheral circuit region of the substrate so as to form a peripheral circuit; performing a second photolithography process by using a second mask plate to form a semiconductor active layer and a patterned source/drain electrode formed on the active layer; performing a third photolithography process by using a third mask plate to form a passivation layer via hole; and performing a fourth photolithography process by using a fourth mask plate to form a pixel electrode electrically connected to the source/drain electrode via the passivation layer via hole.

Further scope of applicability of the disclosed technology will become apparent from the detailed description given hereinafter. However, it should be understood that the detailed description and specific examples, while indicating preferred embodiments of the disclosed technology, are given by way of illustration only, since various changes and modifications within the spirit and scope of the disclosed technology will become apparent to those skilled in the art from the following detailed description.

BRIEF DESCRIPTION OF THE DRAWINGS

The disclosed technology will become more fully understood from the detailed description given hereinafter and the accompanying drawings which are given by way of illustration only, and thus are not limitative of the disclosed technology and wherein.

DETAILED DESCRIPTION

However, by using the double-tone mask plate described above, there occur at least the following disadvantages during the patterning of the first transparent common electrode layer and the gate metal layer on the array substrate of a horizontal electric field type TFT-LCD.

Figure 1:
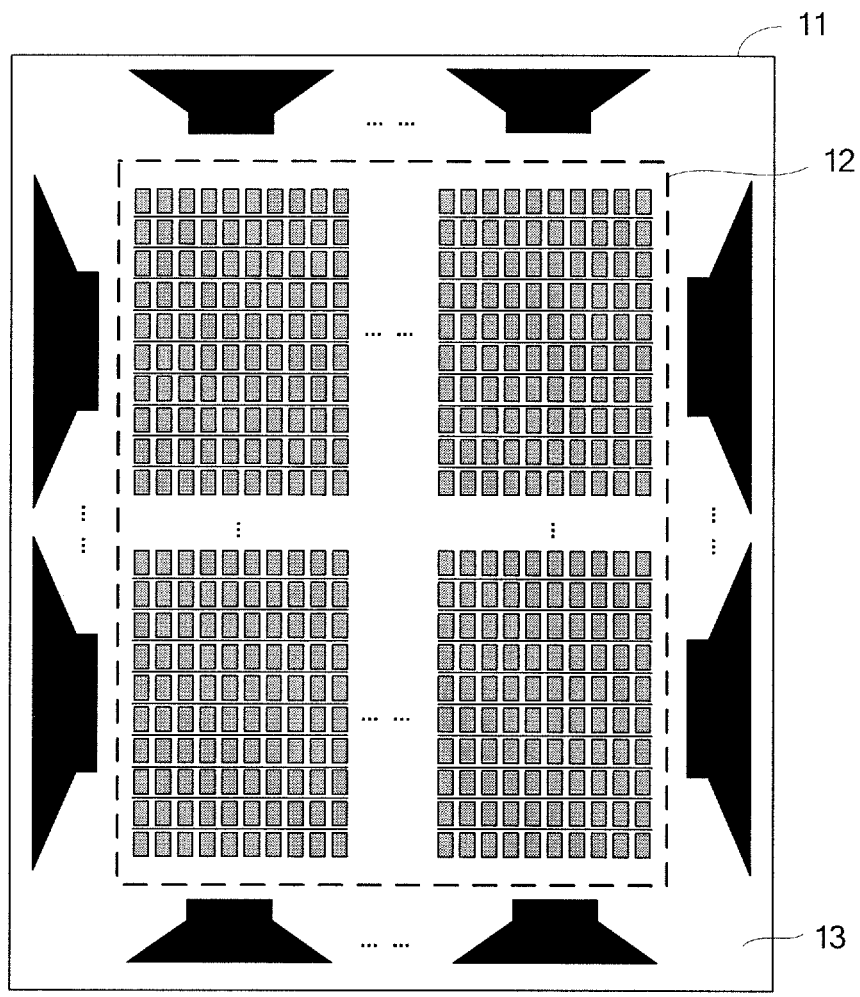
FIG. 1 is a schematic view showing patterns in an existing mask plate.

As shown in FIG. 1, a double-tone mask plate 11 comprises a display pattern region 12 and a peripheral circuit pattern region 13 and is used to expose a photoresist layer applied on an array substrate. In the mask plate, the black region corresponds to a region of the array substrate with photoresist to be totally retained, the translucent gray region corresponds to a region of the array substrate with photoresist to be partially removed, while the white region corresponds to a region of the array substrate with photoresist to be removed. Usually, the photoresist on the array substrate may be about 2 μm in thickness. Since the thickness of the photoresist corresponding to the gray region is decreased by about 1.7 μm after development, a very thin photoresist layer is retained in the region. Photoresist in regions of the array substrate other than those corresponding to the black region and the gray region of the mask plate will be totally removed during development. Therefore, compared with the photoresist pattern region by using the peripheral circuit pattern region 13, the formation of the photoresist pattern region by using the display pattern region 12 consumes more developer in the development solution, leading to a low developer concentration region.

During the development, a display region of the array substrate is formed corresponding to the display pattern region 12, while a peripheral circuit region of the array substrate is formed corresponding to the peripheral circuit pattern region 13. Since developer consumed during the formation of the display region is much more than that of the peripheral circuit region, the concentration of the development solution in the display region is much lower than that in the peripheral circuit region. Developer in the development solution in the peripheral circuit region will spread or diffuse to the display region due to concentration difference. Therefore, additional photoresist is removed within the half-exposed region of the display region close or adjacent to the peripheral circuit region. As a result, the peripheral morphology of the photoresist in the half-exposed region is degraded, or even the photoresist in the half-exposed region is totally removed.

Since the thickness of a portion of the photoresist in the half-exposed region in the display region is influenced by the relatively higher concentration of developer in the development solution in the adjacent peripheral circuit region, the thickness of the photoresist in the display region become nonuniform. Thus difficulties in the subsequent processes such as etching and parameters controlling will increase, and mura may appear, reducing product quality and yield.

An embodiment of the disclosed technology provides a mask plate comprising a first pattern region, a second pattern region, and a redundant pattern provided between the first pattern region and the second pattern region. The first and second pattern regions have different exposure levels.

Another embodiment of the disclosed technology provides a patterning method comprising: forming a structure layer to be patterned on a substrate; applying a layer of photoresist on the structure layer; exposing the photoresist layer with the above mentioned mask plate; developing the exposed photoresist layer to form a photoresist mask; etching the underlying structure layer with the formed photoresist mask.

Because the first and second pattern regions have different exposure levels, the exposed photoresist in corresponding regions has different exposure levels, and after development, the photoresist in the corresponding regions has different thickness; for example, one region is a photoresist-partially-removed region, and the other is a photoresist-totally-resist region.

The portion of the formed photoresist pattern corresponding to the redundant pattern may belong to a photoresist-partially-retained region or a photoresist-totally-retained region. Preferably, the formed photoresist pattern corresponding to the redundant pattern is a photoresist-totally-retained region. According to the type of the applied photoresist, the redundant pattern may belong to a transparent region, a partially transparent region, or a light-blocking region on the mask plate. As well known, for a kind of positive photoresist, the exposed portion will be removed but the unexposed portion will be retained in development, while for a kind of negative photoresist, the exposed portion will be retained but the unexposed portion will be removed in development.

The structure obtained due to existence of the redundant photoresist pattern after the structure is etched with the formed photoresist may be removed in a subsequent process and will not disadvantageously affect the necessary patterns.

Another embodiment of the disclosed technology provides a method for manufacturing an array substrate, comprising:
performing a first photolithography process on a substrate by using the mask plate described above as a first mask plate, wherein during exposure the first pattern region of the mask plate corresponds to the display region on the substrate used to form a first transparent common electrode and the gate circuit in a display region of the substrate, and the second pattern region of the mask plate corresponds to the peripheral circuit region of the substrate to form peripheral circuit;
performing a second photolithography process by using a second mask plate to form a semiconductor active layer and a patterned source/drain electrode formed on the active layer;
performing a third photolithography process by using a third mask plate to form a passivation layer via hole; and
performing a fourth photolithography process by using a fourth mask plate to form a pixel electrode electrically connected to the source/drain electrode via the passivation layer via hole.

The gate circuit includes a gate line and a gate electrode of a thin film transistor that is connected with or formed integratedly with the gate line.

Since the redundant pattern is provided between the first and second pattern regions of the mask plate according to the embodiment of the disclosed technology, during development a redundant photoresist pattern can be formed corresponding to the redundant pattern in the mask plate, preventing the diffusion of the developer between the photoresist patterns corresponding to the first and second pattern regions of the mask plate.

Since the redundant photoresist pattern can prevent the diffusion of the developer between adjacent regions, thickness nonuniformity of the photoresist layer on the substrate can be lessened or eliminated. In this case, difficulties in subsequent processes such as etching, parameters controlling and possible mura in the existing technology can be avoided or reduced, thus preventing a reduction in product quality and yield.

Hereinafter, embodiments of the disclosed technology will be described in detail with reference to the accompanying drawings so that the objectives, technical solutions and advantages of the embodiments will become more apparent. It should be noted that the embodiments described below are merely a portion of but not all of the embodiments of the disclosed technology, and thus various modifications, combinations or alterations can be made on the basis of the described embodiments without departing from the spirit and scope of the disclosed technology.

First Embodiment

Figure 2:
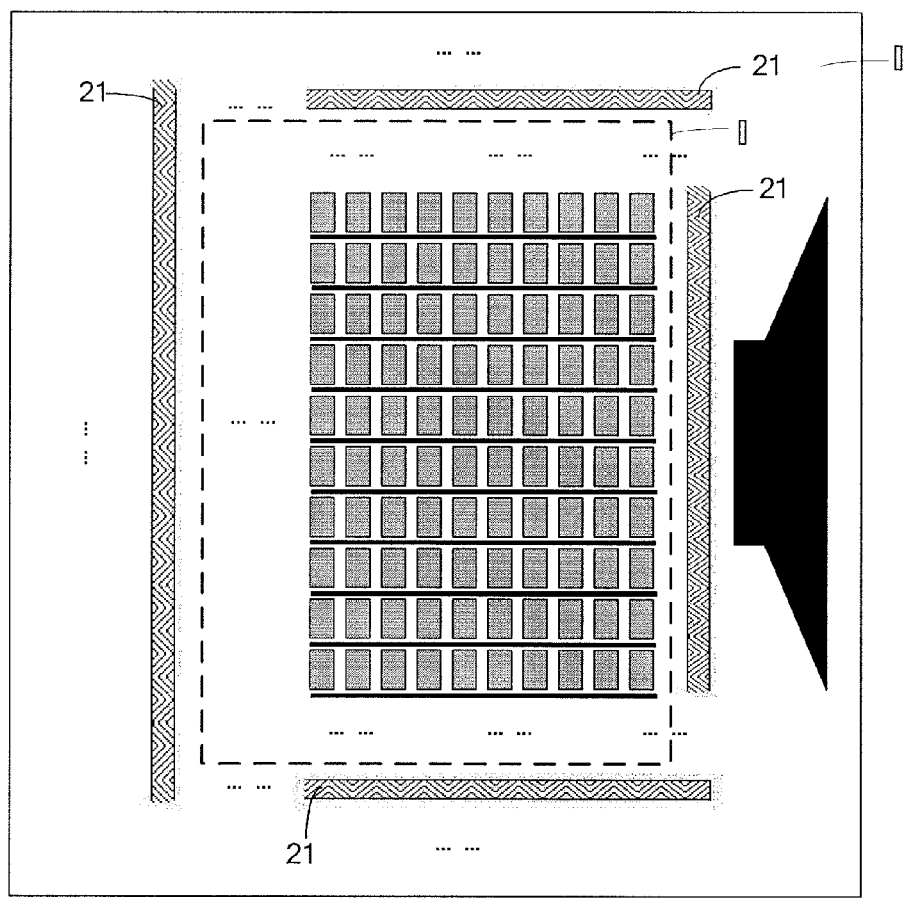
FIG. 2 is a schematic view showing patterns in a mask plate of a first embodiment of the disclosed technology.

FIG. 2 shows a mask plate comprising a first pattern region I and a second pattern region II, according to an embodiment of the disclosed technology. The first pattern region I and the second pattern region II have different exposure levels.

The mask plate can be used to manufacture the array substrate of a horizontal electric field type TFT-LCD. The first pattern region I is used to form a pixel array pattern in the photoresist layer on the display region of the array substrate; the second pattern region II is used to form a peripheral circuit pattern in the photoresist layer on the peripheral circuit region of the array substrate. The mask plate further comprises a redundant pattern 21 provided between the first pattern region I and the second pattern region II.

The redundant pattern 21 includes four portions on the four sides around the first pattern region I. The redundant pattern 21 can include more or less portions around the first pattern region I; for example, the four portions as shown in the FIG. 2 may be connected together, or any two adjacent portions may be connected together. The scope of the disclosed technology is not limited to this arrangement of the redundant pattern.

Further, in the example as shown in FIG. 2, the redundant pattern 21 is located in the second pattern region II; in another example, the redundant pattern 21 can be located in the first pattern region II. The scope of the disclosed technology is not limited to this arrangement.

After exposing the photoresist applied on the array substrate by using the mask plate, during development, the display region photoresist pattern and the peripheral circuit region photoresist pattern can be formed, and a redundant photoresist pattern can also be formed between the display region photoresist pattern and the peripheral circuit region photoresist pattern. The developer diffusion due to concentration difference from one side of the redundant photoresist pattern to the other side can be blocked, since the redundant photoresist pattern is provided between the display region photoresist pattern and the peripheral circuit region photoresist pattern and slows the flow of the used development solution between the regions. In other words, the higher concentration developer in the peripheral circuit region is prevented from spreading or diffusing to the lower concentration developer in the display region. Therefore, thickness nonuniformity of the photoresist on the substrate can be eliminated or reduced. Accordingly, the difficulties in the subsequent processes such as etching, parameters controlling and the possible mura in the existing technology can be avoided or reduced, thus preventing a reduction in product quality and yield.

Furthermore, a redundant pattern with smaller area in the mask plate will be correspondingly used to form a redundant photoresist pattern with smaller area on a substrate with more developer being consumed, which is more helpful to enable the developer in the display region photoresist pattern and the developer in the peripheral circuit region photoresist pattern to achieve a concentration balance therebetween.

It should be understood that although the mask plate described above is adapted for fabricating the array substrate of a horizontal electric field type TFT-LCD in the embodiment of the disclosed technology, it also can be adapted for fabricating the array substrates of other semiconductor devices, for example a vertical electric field type TFT-LCD such as TN mode, as long as there is a problem that the photoresist patterns in different pattern regions on the array substrate are differently consumed in development, causing developer diffusion from a high concentration region to a low concentration region during development.

Figure 3:
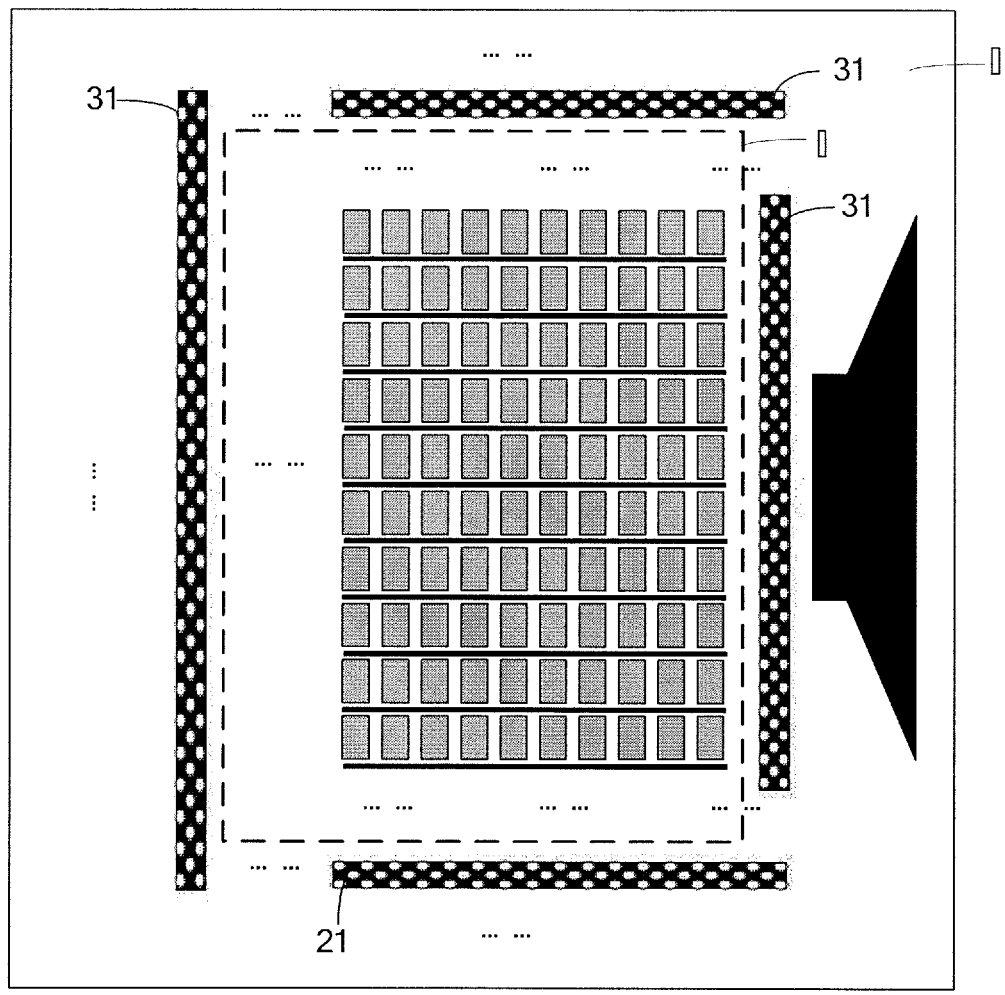
FIG. 3 is a schematic view showing patterns of another mask plate of the first embodiment of the disclosed technology.

The redundant pattern 21, as shown in FIG. 2, is in the shape of a strip, however, other shapes may be adopted for the redundant pattern 21, depending on the shape of the gap between the first pattern region I and the second pattern region II on the array substrate. The redundant pattern may have wave or undulation lines, as shown in FIG. 2; or the redundant pattern 31, as shown in FIG. 3, may have round holes. The holes may be in other shape, such as a square or triangle shape. In fact, redundant patterns with any structure can play a role in preventing the developer diffusion from a high concentration region to a lower concentration region during development, and the scope of the disclosed technology is not limited thereto.

Second Embodiment

The embodiment of the disclosed technology provides a patterning method for a layer. In this method, a structure layer to be patterned is first formed on a substrate, and this structure layer may be a conductive layer (e.g., a metal layer) for forming conductive lines on the substrate or an insulation layer such as an interlayer or a passivation layer for forming via holes therein. A layer of photoresist is applied on the structure layer, and the photoresist layer is exposed, for example, with the mask plate in the first embodiment, thus a latent image corresponding to the patterns to be formed is obtained in the photoresist layer. Then, the exposed photoresist layer is developed with a development solution to form a photoresist pattern for etching. The photoresist pattern includes a first pattern region, a second pattern region, and a redundant pattern region, and the redundant pattern region can prevent developer from diffusing between the first and second pattern regions, that is, from the high developer concentration region to the low developer concentration region.

After development, the formed photoresist pattern is used as an etching mask to pattern the underlying structure layer to form the desired pattern, such as conductive lines or via holes.

Third Embodiment

The embodiment of the disclosed technology provides a method for manufacturing an array substrate. The array substrate can be an array substrate of a horizontal electric field type TFT-LCD. The mask plate with a redundant pattern disclosed in the first embodiment is adopted in the first mask step according to the embodiment of the disclosed technology.

The manufacturing method comprises the following steps.

Step 1, performing a first photolithography process on a substrate by using a first mask plate, the first mask plate comprising a first pattern region for exposing the display region of the substrate to form a first transparent common electrode and a gate circuit, a second pattern region for exposing the peripheral circuit region of the substrate to form peripheral circuit, and a redundant pattern provided between the first pattern region and the second pattern region.

After exposing of photoresist applied on the array substrate by using the first mask plate, during development, a display region photoresist pattern, a peripheral circuit region photoresist pattern, and a redundant photoresist pattern, respectively corresponding to the first pattern region, the second pattern region, and the redundant pattern in the first mask plate, between the display region photoresist pattern and the peripheral circuit region photoresist pattern can be formed on the array substrate. The redundant photoresist pattern is capable of preventing developer diffusion between the regions.

The development solution of higher developer concentration in the peripheral circuit region is prevented from spreading or diffusing to the development solution of lower developer concentration in the display region, due to the photoresist redundant pattern. Therefore, thickness nonuniformity of the photoresist layer in the half-exposed region in the display region adjacent to the peripheral region can be eliminated or reduced. Accordingly, the difficulties in the subsequent processes such as etching, parameters controlling and the possible mura in the existing technology can be avoided, thus preventing a reduction in product quality and yield.

The redundant pattern may be in a strip shape or in other shapes, depending on the shape of the gap between the two pattern regions. The redundant pattern may have wave lines or holes such as round holes or square holes. In fact, redundant patterns with any structure therein can play a role in avoiding the developer diffusion from a high developer concentration region to a low developer concentration region during development. Therefore, developer in the display region and developer in the peripheral circuit region can achieve a concentration balance which in turn leads to a good thickness uniformity of photoresist in the half-exposed region in the display region.

Step 2, performing a second photolithography process on the substrate with the first transparent common electrode and the gate circuit formed thereon by using a second mask plate, so as to form a semiconductor active layer and a patterned source/drain electrode on the active layer.

Step 3, depositing a passivation layer on the substrate with the semiconductor active layer and the source/drain electrode formed thereon, and performing a third photolithography process by using a third mask plate to form a passivation layer via hole.

Step 4, depositing a second transparent common electrode layer on the substrate with the passivation layer formed thereon and filling the passivation layer via holes, then performing a fourth photolithography process by using a fourth mask plate to form a pixel electrode electrically connected to the source/drain electrode via the passivation layer via hole.

An array substrate of a horizontal electric field type TFT-LCD can be manufactured by performing a four-mask process according to the embodiment of the disclosed technology, so as to increase the product quality and yield. The gate circuit includes a gate line and a gate electrode of a thin film transistor that is connected with or formed integratedly with the gate line.

It should be understood that although the mask plate described above is adopted for fabricating the array substrate of a horizontal electric field type TFT-LCD in the embodiment of the disclosed technology, it also can be adapted for fabricating the array substrates of other semiconductor devices, as long as there is a problem that the photoresist patterns provided in different pattern regions on the array substrate is consumed differently during development to allow developer diffusion from a high concentration region to a low concentration region.

The disclosed technology being thus described, it will be obvious that the same may be varied in many ways. Such variations are not to be regarded as a departure from the spirit and scope of the disclosed technology, and all such modifications as would be obvious to those skilled in the art are intended to be comprised within the scope of the following claims.

What is claimed is:

1. A mask plate for a photolithography process comprising:
   a first pattern region configured for forming a pixel array pattern in a photoresist layer on a display region of an array substrate,
   a second pattern region having a different exposure level from that of the first pattern region and configured for forming a peripheral circuit pattern in a photoresist layer on a peripheral circuit region of the array substrate, and
   a redundant pattern provided between the first pattern region and the second pattern region, wherein the redundant pattern is spaced apart from patterns in the first and second pattern region,
   wherein the redundant pattern is configured for forming a redundant photoresist pattern so as to prevent developer diffusion at different concentrations across the photoresist redundant pattern.

2. The mask plate according to claim 1, wherein the redundant pattern is in a strip shape.

3. The mask plate according to claim 2, wherein the redundant pattern has wave lines.

4. The mask plate according to claim 2, wherein the redundant pattern has holes.

5. The mask plate according to claim 1, wherein the redundant pattern has wave lines.

6. The mask plate according to claim 1, wherein the redundant pattern has holes.

* * * * *